(12) United States Patent
Pagette et al.

(10) Patent No.: US 7,394,113 B2
(45) Date of Patent: Jul. 1, 2008

(54) SELF-ALIGNMENT SCHEME FOR A HETEROJUNCTION BIPOLAR TRANSISTOR

(75) Inventors: Francois Pagette, Wappingers Falls, NY (US); Anna Topol, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 111 days.

(21) Appl. No.: 11/460,013

(22) Filed: Jul. 26, 2006

(65) Prior Publication Data
US 2008/0121936 A1    May 29, 2008

(51) Int. Cl.
*H01L 29/70* (2006.01)
(52) U.S. Cl. .............. 257/197; 257/565; 257/578; 257/583; 257/585; 257/588; 257/593; 438/253
(58) Field of Classification Search .......... 257/197, 257/565, 578, 583, 585, 588, 593
See application file for complete search history.

(56) References Cited

U.S. PATENT DOCUMENTS

| | | | |
|---|---|---|---|
| 5,198,689 A | 3/1993 | Fujioka | |
| 6,489,211 B1 | 12/2002 | Freeman, Jr. et al. | |
| 6,492,238 B1 | 12/2002 | Ahlgren et al. | |
| 6,551,889 B2 | 4/2003 | Kovacic | |
| 6,667,521 B2 | 12/2003 | Ahlgren et al. | |
| 6,767,798 B2 | 7/2004 | Kalnitsky et al. | |
| 6,846,710 B2 | 1/2005 | Yi et al. | |
| 6,979,884 B2 | 12/2005 | Ahlgren et al. | |
| 2003/0020107 A1* | 1/2003 | Bosco et al. ............. | 257/296 |
| 2004/0227213 A1* | 11/2004 | Chen ....................... | 257/592 |
| 2005/0151165 A1 | 7/2005 | Chan et al. | |

\* cited by examiner

*Primary Examiner*—Matthew S. Smith
*Assistant Examiner*—Thanh V. Pham
(74) *Attorney, Agent, or Firm*—Gibb & Rahman, LLC

(57) ABSTRACT

Embodiments herein present a structure, method, etc. for a self-alignment scheme for a heterojunction bipolar transistor (HBT). An HBT is provided, comprising an extrinsic base, a first self-aligned silicide layer over the extrinsic base, and a nitride etch stop layer above the first self-aligned silicide layer. A continuous layer is also included between the first self-aligned silicide layer and the nitride etch stop layer, wherein the continuous layer can comprise oxide. The HBT further includes spacers adjacent the continuous layer, wherein the spacers and the continuous layer separate the extrinsic base from an emitter contact. In addition, an emitter is provided, wherein the height of the emitter is less than or equal to the height of the extrinsic base. Moreover, a second self-aligned silicide layer is over the emitter, wherein the height of the second silicide layer is less than or equal to the height of the first silicide layer.

7 Claims, 12 Drawing Sheets

SELF-ALIGNMENT SCHEME FOR A HETEROJUNCTION BIPOLAR TRANSISTOR

BACKGROUND OF THE INVENTION

1. Field of the Invention

Embodiments herein present a device, method, etc. for a self-alignment scheme for a heterojunction bipolar transistor.

2. Description of the Related Art

For heterojunction bipolar transistors (HBTs) with a blanket silicon germanium (SiGe) layer, protecting the low temperature epitaxy (LTE) layer from reactive ion etching (RIE) is necessary to control vertical doping profile of the intrinsic part of the device. One approach is to use an etch stop layer on which an emitter opening land upon. This leads to a non-self-aligned emitter/extrinsic-base.

Another approach uses a sacrificial pedestal to define the extrinsic-base. The sacrificial pedestal is later removed to be replaced by the emitter poly. This approach is self-aligned but the final emitter dimension is determined by several process steps (pedestal, spacers, gap created by the removal of the sacrificial pedestal, a second set of spacers) which makes control and scaling of the emitter difficult.

To reduce base resistance, it is advantageous to silicide the extrinsic-base up to the spacer separating the emitter to the extrinsic-base. The resulting emitter plug is of minimum dimension and is difficult to contact by metallization without creating shorts between the emitter contact and the near-by extrinsic-base.

SUMMARY OF THE INVENTION

Embodiments herein present a structure, method, etc. for a self-alignment scheme for a heterojunction bipolar transistor (HBT). An HBT is provided, comprising an extrinsic base, a first self-aligned silicide layer over the extrinsic base, and a nitride etch stop layer above the first self-aligned silicide layer. A continuous layer is also included between the first self-aligned silicide layer and the nitride etch stop layer, wherein the continuous layer can comprise oxide. The HBT further includes spacers adjacent the continuous layer, wherein the spacers and the continuous layer separate the extrinsic base from an emitter contact. In addition, an emitter is provided, wherein the height of the emitter is less than or equal to the height of the extrinsic base. Moreover, a second self-aligned silicide layer is over the emitter, wherein the height of the second silicide layer is less than or equal to the height of the first silicide layer.

A method of forming an HBT comprises forming an extrinsic base, a first self-aligned silicide layer over the extrinsic base, a continuous layer over the first self-aligned silicide layer, and a nitride etch stop layer over the continuous layer. Spacers are also formed, wherein the continuous layer is formed adjacent the spacers such that the spacers and the continuous layer separate the extrinsic base from an emitter contact. The continuous layer can be formed using oxide. The method also forms an emitter, wherein the extrinsic base is formed with a height that is greater than or equal to the height of the emitter. Moreover, a second self-aligned silicide layer is formed over the emitter with a height that is less than or equal to the height of the first silicide layer.

Accordingly, embodiments of the invention provide an HBT which offers a self-aligned extrinsic base and an emitter dimension defined by an opening process for better control and scaling. Furthermore, a self-aligned extrinsic base silicide is included, wherein the silicide reaches the emitter spacer, and wherein the silicide reduces the base resistance. In addition, embodiments herein comprise a plug emitter and a deep collector implant. The process scheme contacts an emitter poly narrower than the emitter contact with protection against emitter-base shorts that rely on a difference in material between a material covering the entire extrinsic-base and a material covering the emitter poly plug (borderless contact).

These, and other, aspects and objects of the present invention will be better appreciated and understood when considered in conjunction with the following description and the accompanying drawings. It should be understood, however, that the following description, while indicating embodiments of the present invention and numerous specific details thereof, is given by way of illustration and not of limitation. Many changes and modifications may be made within the scope of the present invention without departing from the spirit thereof, and the invention includes all such modifications.

BRIEF DESCRIPTION OF THE DRAWINGS

The invention will be better understood from the following detailed description with reference to the drawings, in which.

DETAILED DESCRIPTION OF PREFERRED EMBODIMENTS OF THE INVENTION

Figure 1:
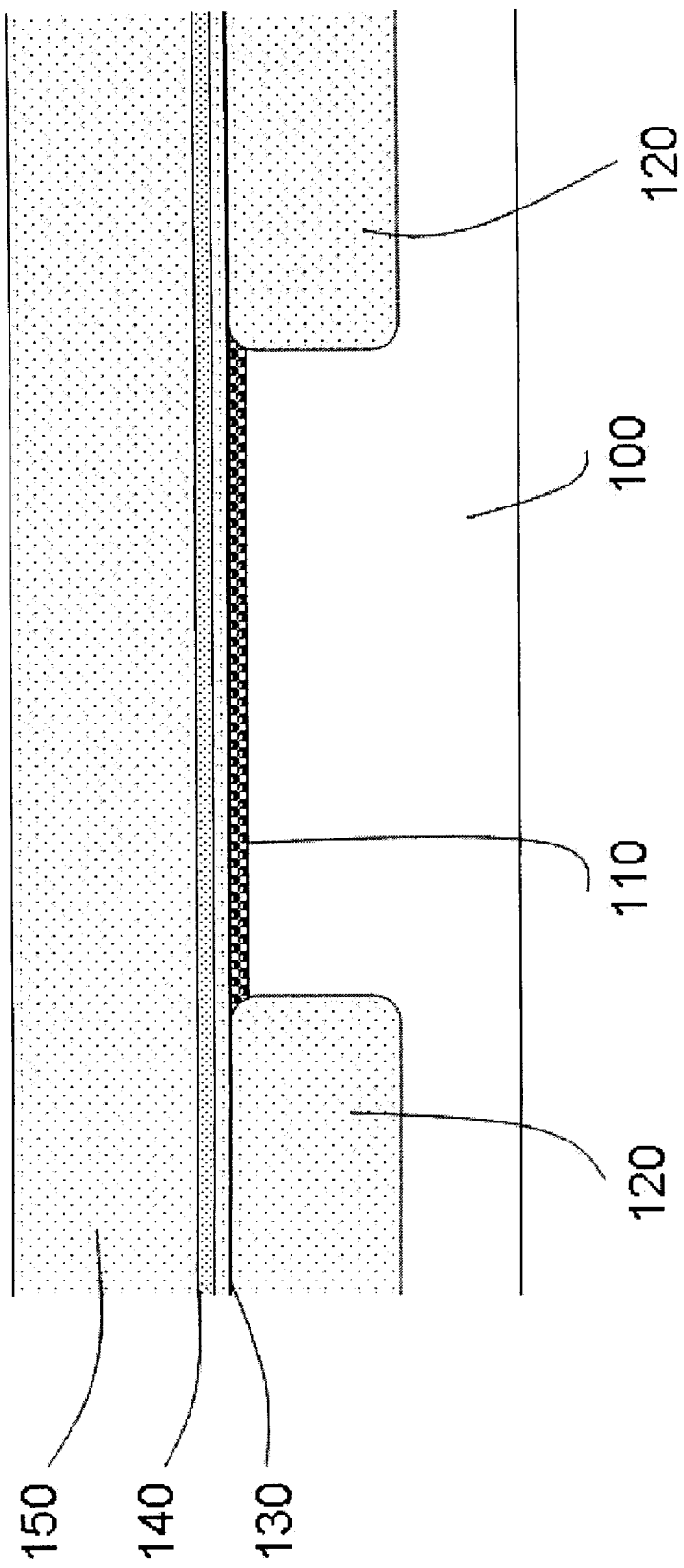
FIG. 1 is a diagram illustrating a cross-sectional view of an oxide layer formed on a substrate.

The present invention and the various features and advantageous details thereof are explained more fully with reference to the nonlimiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the present invention. The examples used herein are intended merely to facilitate an understanding of ways in which the invention may be practiced and to further enable those of skill in the art to practice the invention. Accordingly, the examples should not be construed as limiting the scope of the invention.

Embodiments of the invention provide an HBT which offers a self-aligned extrinsic base and an emitter dimension defined by an opening process for better control and scaling. Furthermore, a self-aligned extrinsic base silicide is included, wherein the silicide reaches the emitter spacer, and wherein the silicide reduces the base resistance. In addition, embodiments herein comprise a plug emitter and a deep collector implant. The process scheme contacts an emitter poly narrower than the emitter contact with protection against emitter-base shorts that rely on a difference in material between a material covering the entire extrinsic-base and a material covering the emitter poly plug (borderless contact).

Referring now to the drawings, FIGS. 1-11 illustrate one embodiment of a method for forming an HBT. More specifically, FIG. 1 illustrates a substrate 100, comprising a single crystal LTE layer 110 and oxide members 120. The LTE layer 110 is in a top middle portion of the substrate 100 and the oxide members 120 are in a top portion of the substrate 100, on both sides of the LTE layer 110. A top surface of the LTE layer 110 is coplanar with top surfaces of the oxide members 120. In addition, a first oxide layer 130 is formed over the oxide members 120 and the LTE layer 110; a first nitride layer 140 is formed over the first oxide layer 130; and a second oxide layer 150 is formed over the first nitride layer 140.

Figure 2:
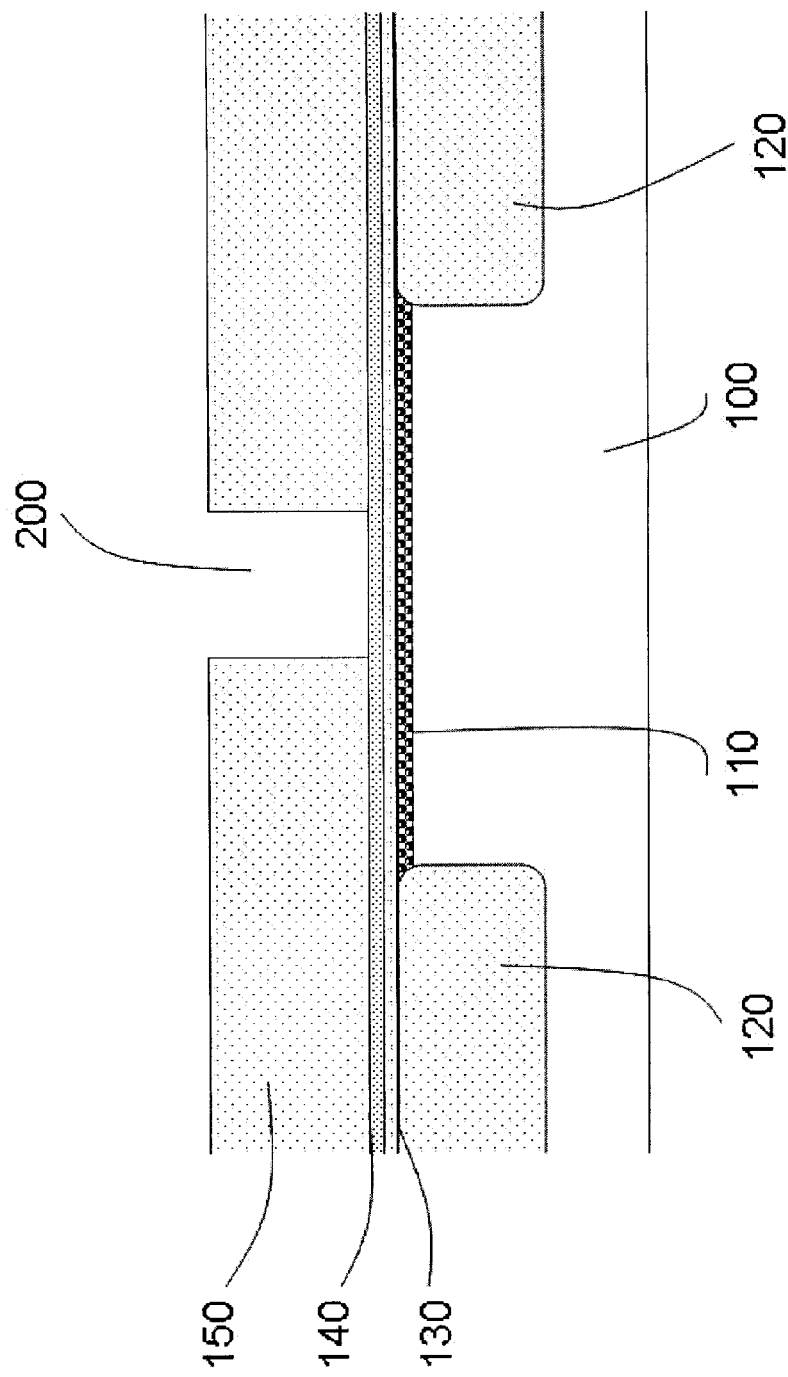
FIG. 2 is a diagram illustrating a cross-sectional view of a gap formed in the oxide layer.
Figure 3:
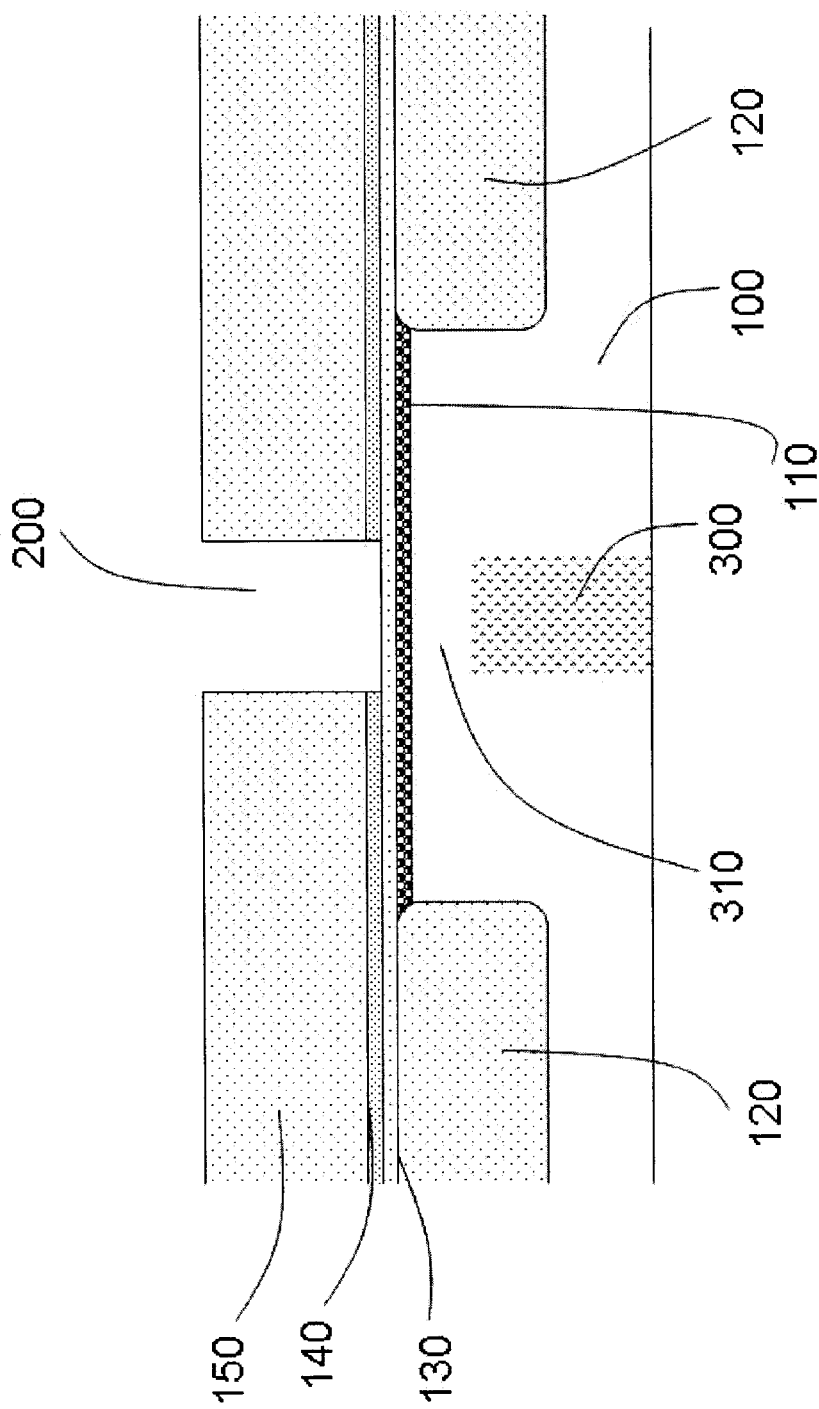
FIG. 3 is a diagram illustrating a cross-sectional view of a collector implanted into the substrate.

The method then removes a center portion of the second oxide layer 150 to form a first gap 200 (see FIG. 2). Next, a center portion of the first nitride layer 140 is removed to extend the first gap 200 (see FIG. 3). The removed portion of the first nitride layer 140 comprises substantially the same width as the removed portion of the second oxide layer 150, wherein the removed portion of the first nitride layer 140 is directly below the removed portion of the second oxide layer 150. The method also implants a collector 300 within a center portion of the substrate 100, wherein the collector 300 is aligned with the first gap 200 and approximately centered between the oxide members 120. Moreover, the collector 300 is implanted below the LTE layer 110, wherein a substrate portion 310 is between the collector 300 and the LTE layer 110.

Figure 4:
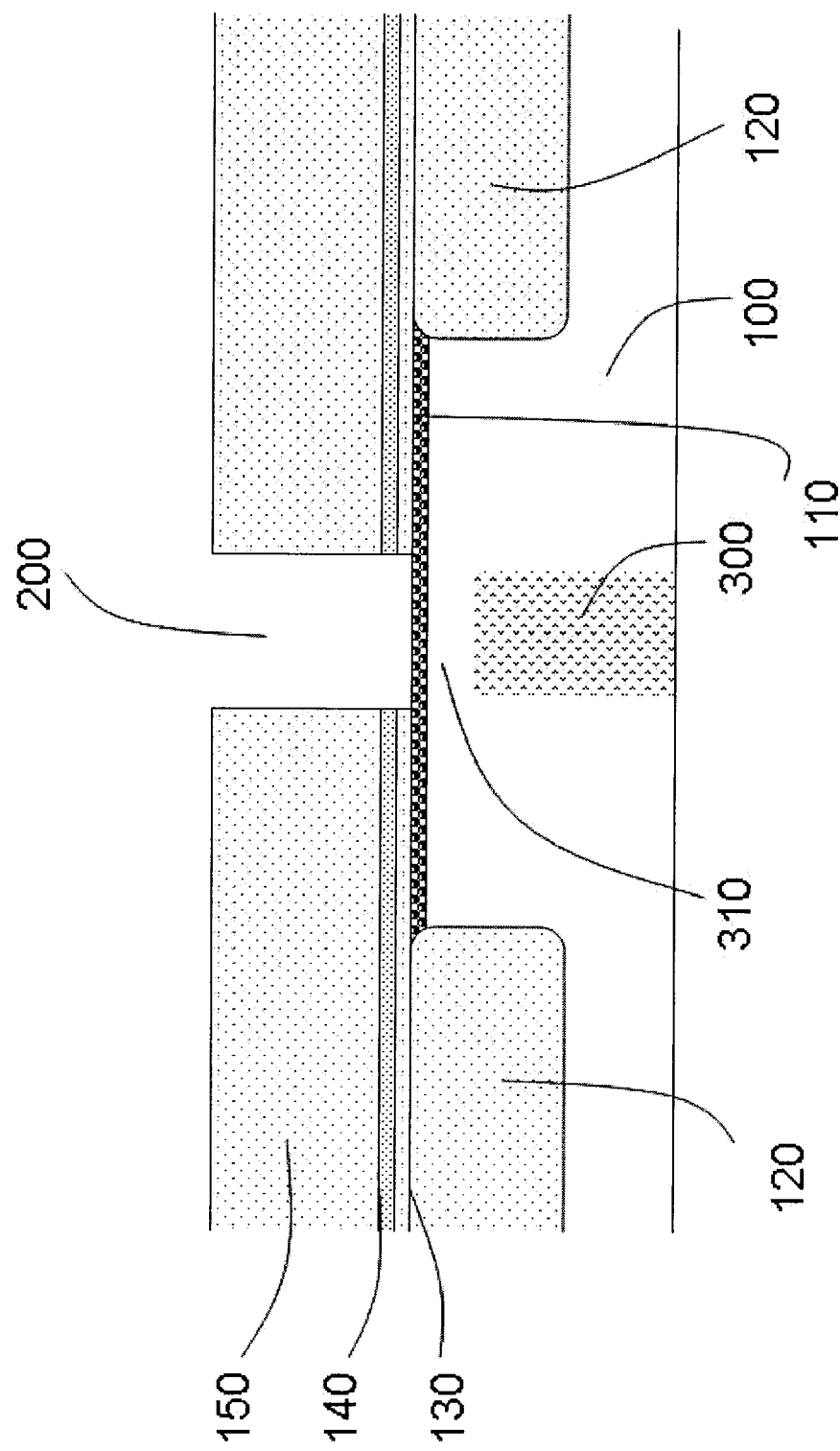
FIG. 4 is a diagram illustrating a cross-sectional view of a gap formed in another oxide layer.

Following this, in FIG. 4, a center portion of the first oxide layer 130 is removed to further extend the first gap 200. The removed portion of the first oxide layer 130 comprises substantially the same width as the removed portions of the first nitride layer 140 and the second oxide layer 150, wherein the removed portion of the first oxide layer 130 is directly below the removed portion of the first nitride layer 140.

Figure 5:
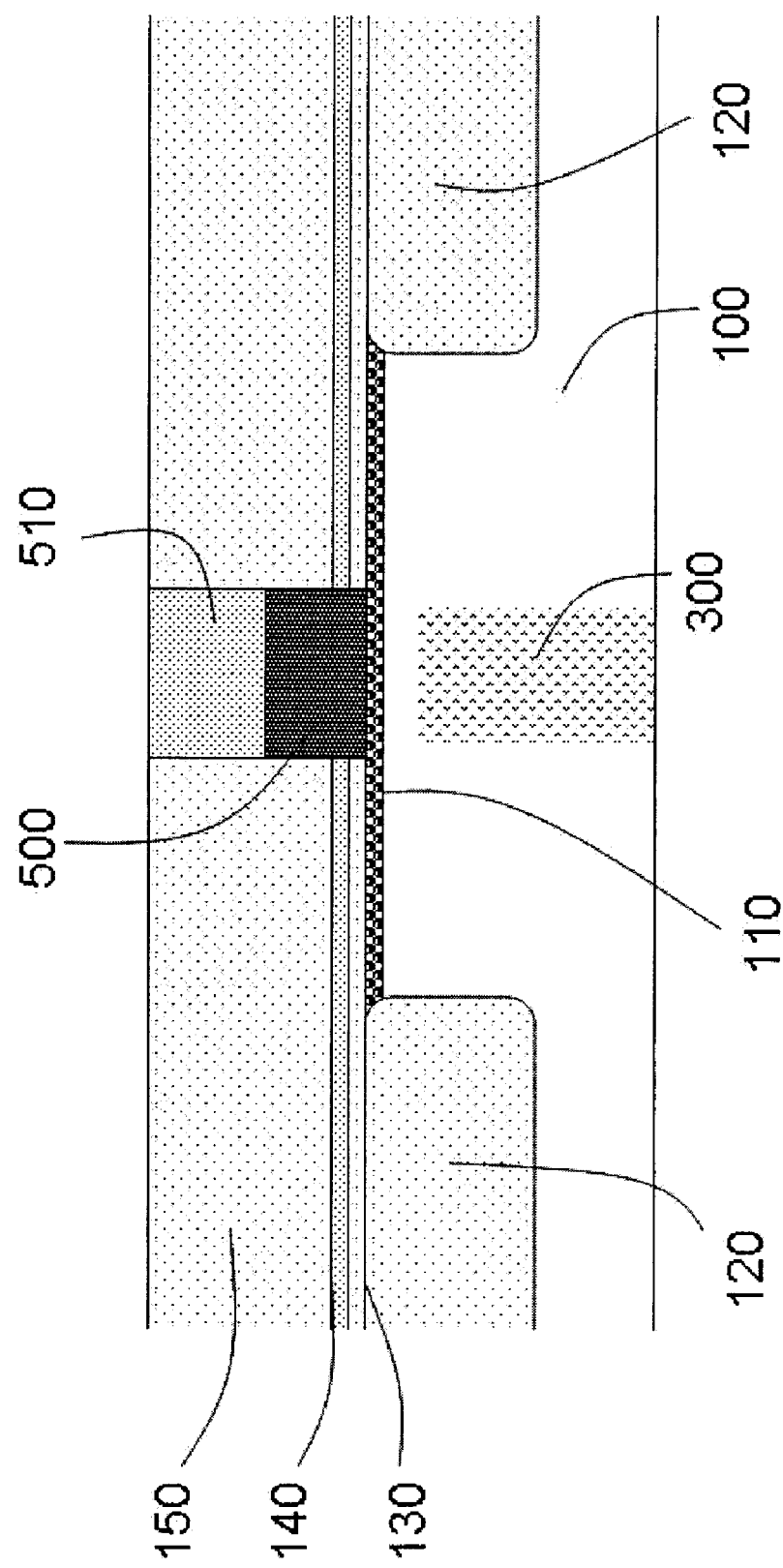
FIG. 5 is a diagram illustrating a cross-sectional view of an emitter and nitride formed in the gap.
Figure 6:
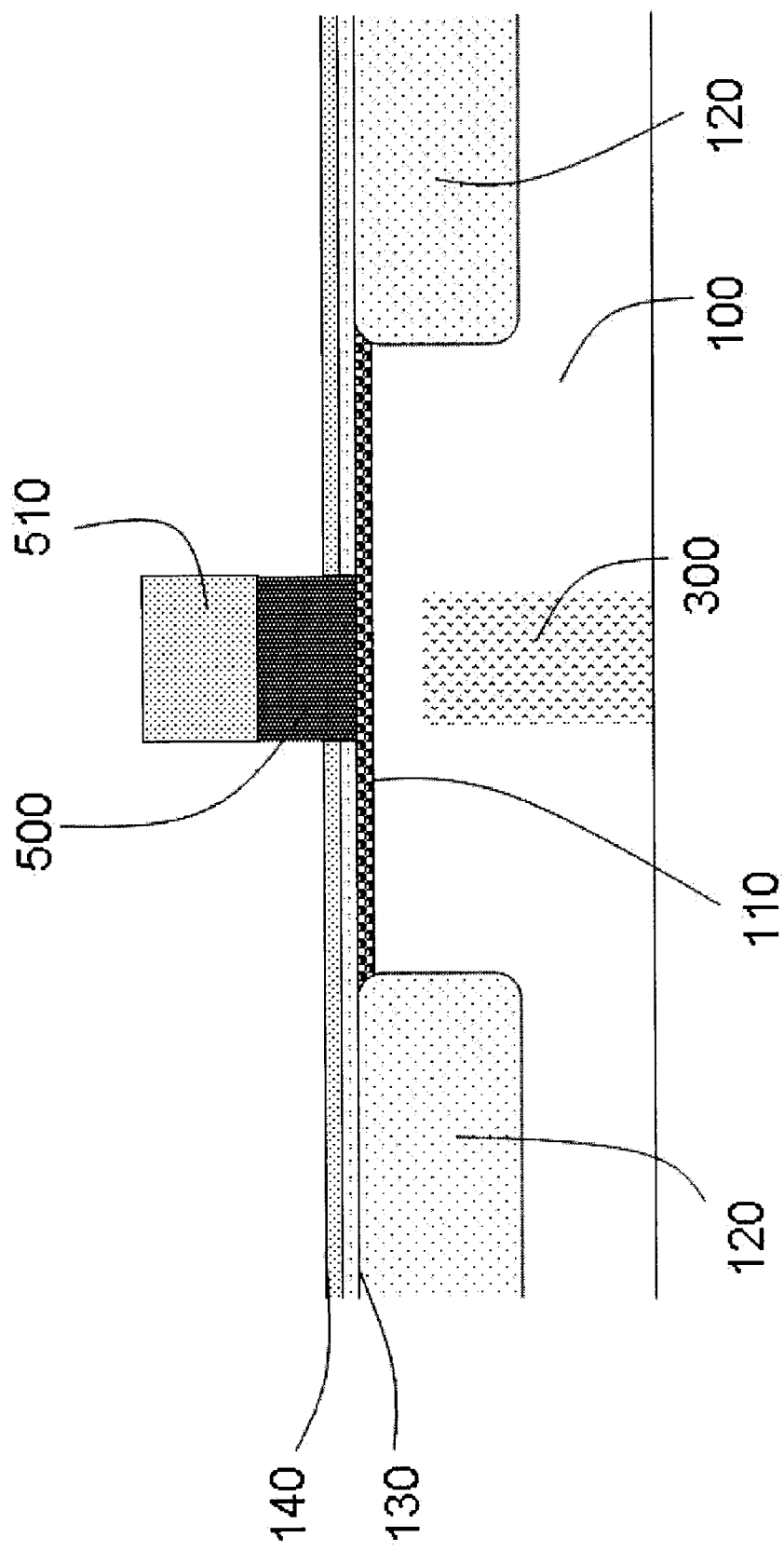
FIG. 6 is a diagram illustrating a cross-sectional view of the emitter and nitride with an oxide layer removed.

As illustrated in FIG. 5, an emitter 500 is formed in a bottom portion of the first gap 200, wherein the emitter 500 is formed from poly. The emitter 500 contacts the LTE layer 110, the first oxide layer 130, the first nitride layer 140, and the second oxide layer 150, wherein the height of the emitter 500 is greater than the height of the first oxide layer 140. Next, a nitride member 510 is formed in a top portion of the first gap 200 over the emitter 500, wherein the nitride member 510 contacts the second oxide layer 150. A top surface of the nitride member 510 is coplanar with a top surface of the second oxide layer 150. Further, the emitter 500 comprises a thickness that is approximately similar to the thickness of the nitride member 510, wherein the emitter 500 fills the bottom half of the first gap 200 and the nitride member 510 fills the top half of the first gap 200.

Figure 7:
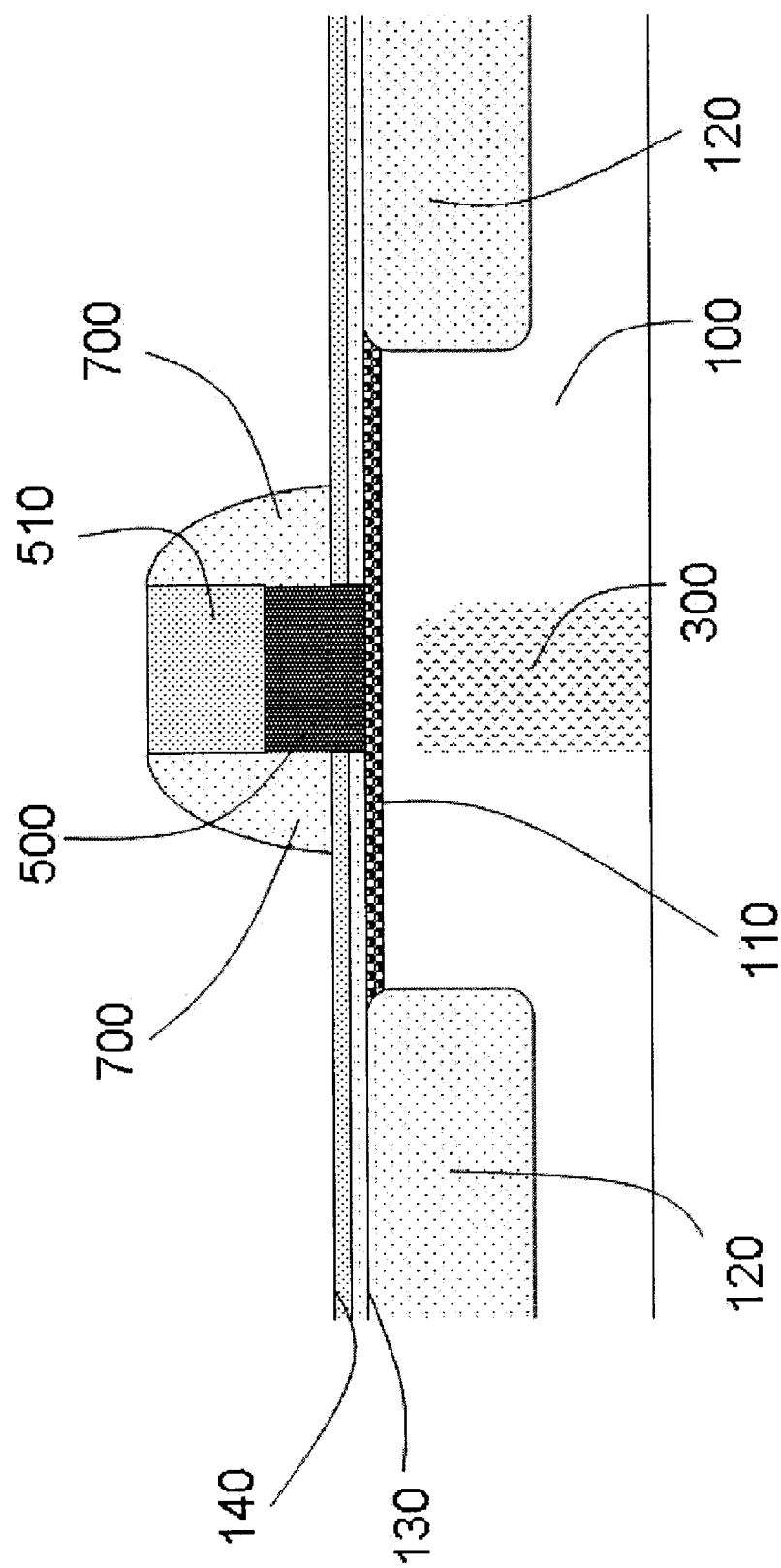
FIG. 7 is a diagram illustrating a cross-sectional view of spacers formed adjacent the emitter and nitride.

Subsequently, the second oxide layer 150 is removed (see FIG. 6) and spacers 700 are formed adjacent the emitter 500 and the nitride member 510 (see FIG. 7). The spacers 700 are formed on both sides of the emitter 500 and the nitride member 510 and over portions of the first nitride layer 140. Moreover, the spacers 700 can be formed from oxide, wherein the top of the spacers 700 are coplanar with the top surface of the nitride member 510. The combined width of the emitter 500 and the spacers 700 is less than the width of the LTE layer 110.

Figure 8:
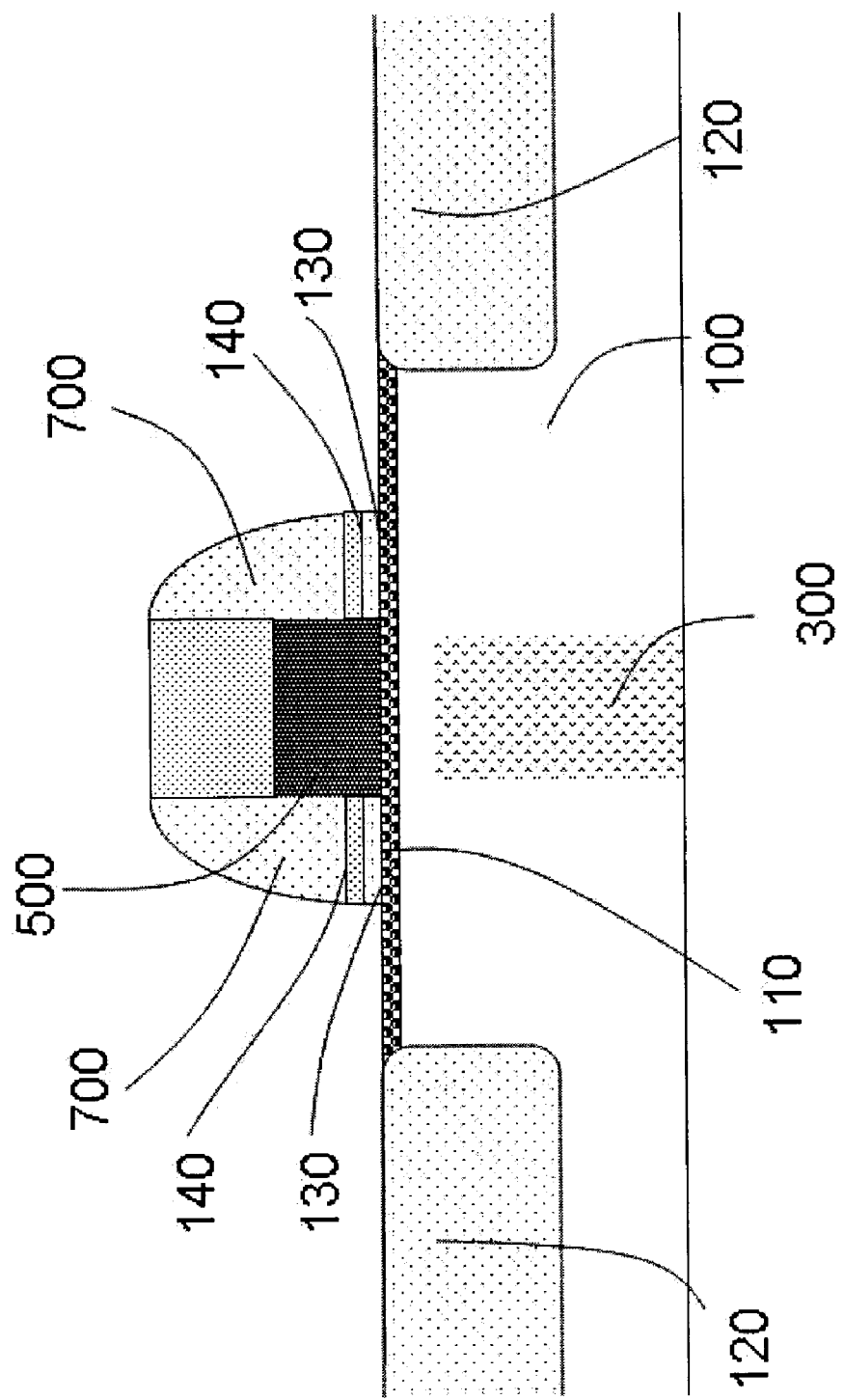
FIG. 8 is a diagram illustrating a cross-sectional view of oxide and nitride layers removed from an area proximate the spacers.

The method then removes portions of the first oxide layer 130 and the first nitride layer 140 that are not covered by the spacers 700 (see FIG. 8). Thus, portions of the first oxide layer 130 and the first nitride layer 140 remain between the spacers 700 and the LTE layer 110, wherein such portions are adjacent the emitter 500.

Figure 9:
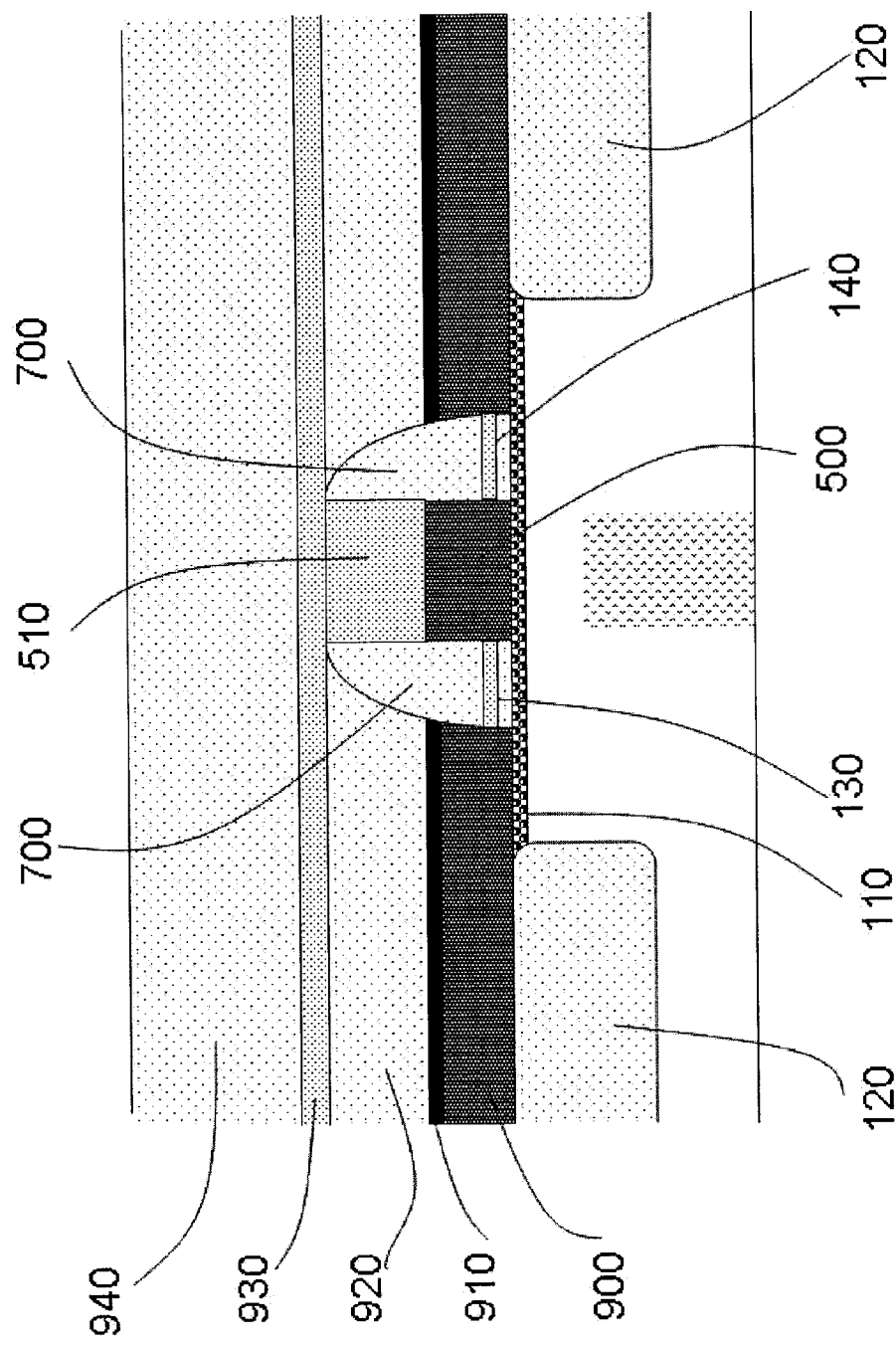
FIG. 9 is a diagram illustrating a cross-sectional view of poly, silicide, oxide, and nitride layers formed above the substrate.

Next, as illustrated in FIG. 9, a poly layer 900 (also referred to herein as the "extrinsic base 900") is formed over the oxide members 120 and portions of the LTE layer 110 that are not covered by the spacers 700 and the emitter 500. The height of the poly layer 900 is greater than or equal to the height of the emitter 500 and greater than or equal to the height of the first nitride layer 140. Moreover, the poly layer 900 is adjacent to the first oxide layer 130 and the first nitride layer 140 and adjacent to and shorter than the spacers 700.

A first silicide layer 910 is then formed over the poly layer 900, wherein the first silicide layer 910 is adjacent to the spacers 700 and below the top portion of the spacers 700. Thus, the first silicide layer comprises a height that is greater than the height of the first nitride layer 140. The method then forms a third oxide layer 920 (also referred to herein as the "continuous layer") over the first silicide layer 910, wherein the third oxide layer 920 is adjacent to the spacers 700. The top surface of the third oxide layer 920 can be coplanar with the top of the spacers 700, for example, by deposition and polish back.

The emitter 500 and the nitride member 510 are used to align the formation of the spacers 700, wherein the spacers 700 are used to align the formation of the poly layer 900, the first silicide layer 910 (thus forming what is referred to herein as the "first self-aligned silicide layer"), and the third oxide layer 920. Following this, a second nitride layer 930 (also referred to herein as the "nitride etch stop layer 930") is formed over the third oxide layer 920, the spacers 700, and the nitride member 510; and, a fourth oxide layer 940 is formed over the second nitride layer 930.

Figure 10:
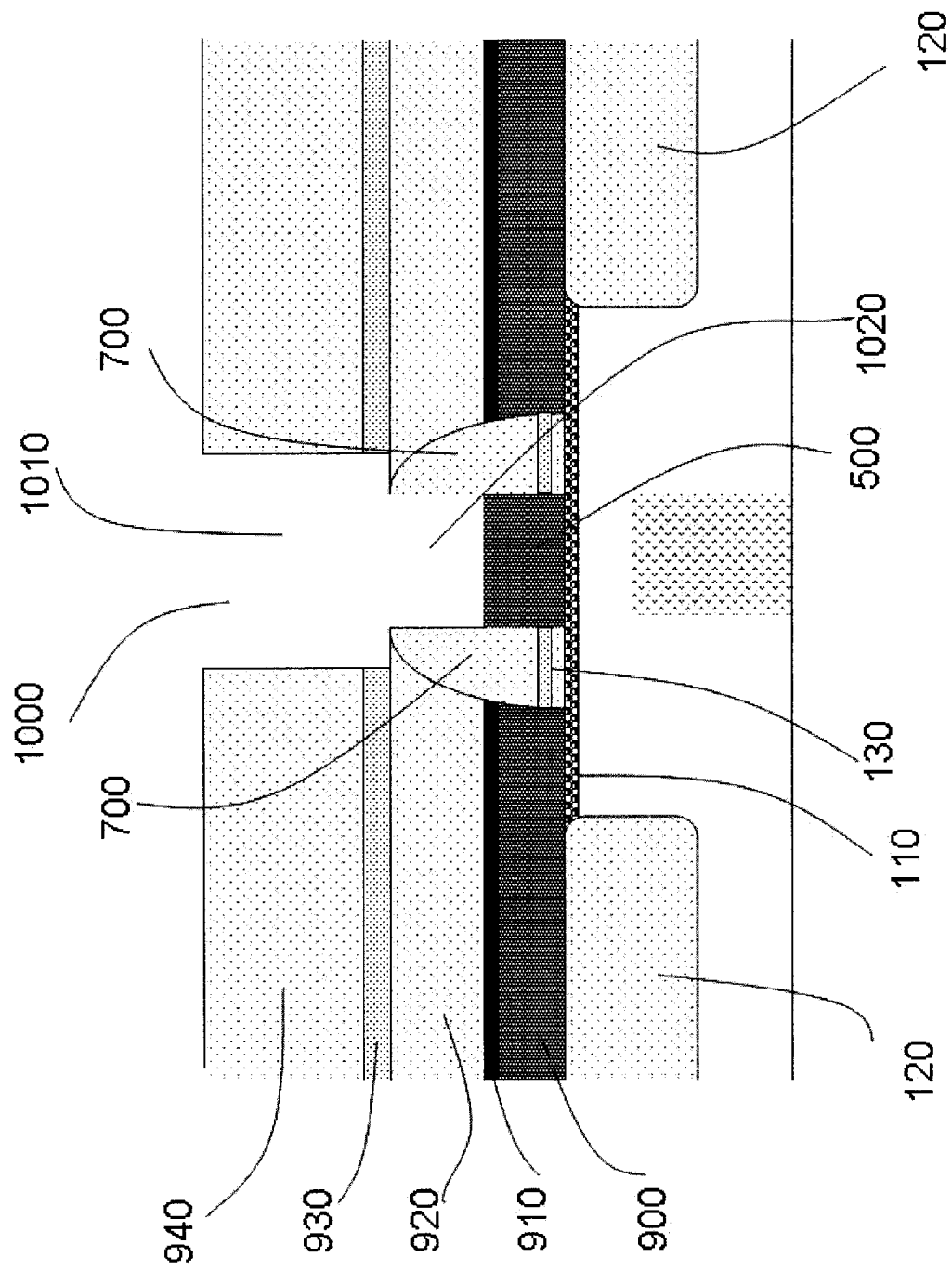
FIG. 10 is a diagram illustrating a cross-sectional view of a gap formed in the oxide and nitride layers.

Subsequently, in FIG. 10, a second gap 1000 if formed over the emitter 500. More specifically, a center portion of the fourth oxide layer 940 is removed stopping at the second nitride layer 930. The method then removes a center portion of the second nitride layer 930 to form a top portion 1010 of the second gap 1000. The removed portion of the second nitride layer 930 comprises substantially the same width as the removed portion of the fourth oxide layer 940, wherein the removed portion of the second nitride layer 930 is directly below the removed portion of the fourth oxide layer 940. Further, the width of the top portion 1010 of the second gap 1000 is greater than the width of emitter 500 and less than the combined width of the emitter 500 and the spacers 700. The nitride member 510 is also removed to form a bottom portion 1020 of the second gap 1000. The width of the bottom portion 1020 is substantially equal to the width of the emitter 500; thus, the second gap 1000 is substantially T-shaped.

Figure 11:
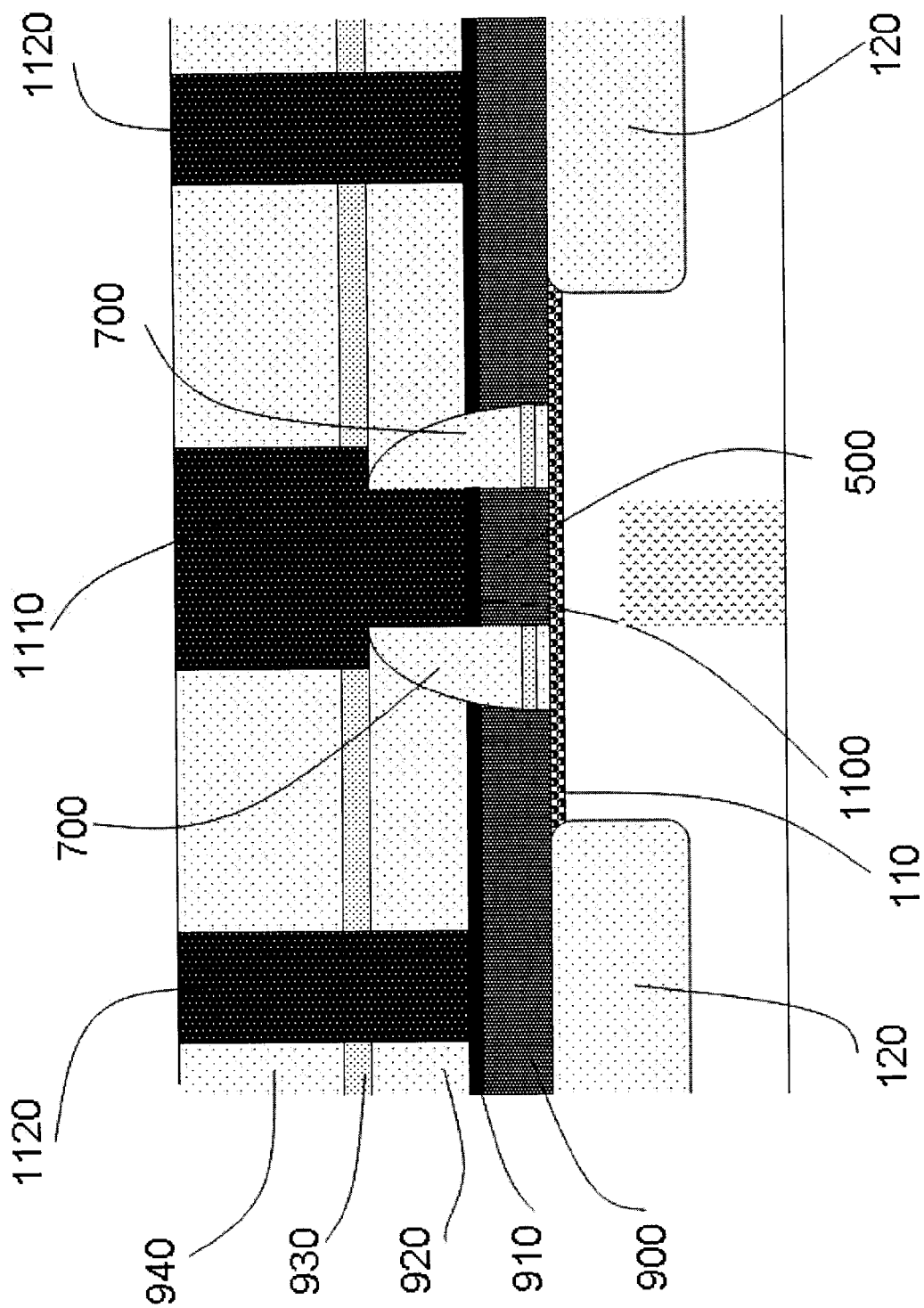
FIG. 11 is a diagram illustrating a cross-sectional view of contacts formed within the gap and the oxide and nitride layers.

Next, as illustrated in FIG. 11, a second silicide layer 1100 is formed over the emitter 500, wherein the second silicide layer 1100 is between (and is self-aligned by) the spacers 700. The height of the second silicide layer 1100 is less than or equal to the height of the first silicide layer 910. The method then forms an emitter contact 1110 over the second silicide layer 1100, wherein the emitter contact 1110 fills the second gap 1000. The emitter contact 1110 contacts the fourth oxide layer 940, the second nitride layer 930, a portion of the third oxide layer 920, and the spacers 700. Moreover, the emitter contact 1110 is above the poly layer 900, wherein a top surface of the emitter contact 1110 is coplanar with a top surface of the fourth oxide layer 940.

Following this, contacts 1120 are formed through the fourth oxide layer 940, the second nitride layer 930, and the third oxide layer 920. The contacts 1120 are formed over the oxide members 120, wherein the contacts 1120 contact the first silicide layer 910. Further, the top surfaces of the contacts 1120 are coplanar with the top surface of the fourth oxide layer 940.

Embodiments herein present a structure, method, etc. for a self-alignment scheme for a heterojunction bipolar transistor (HBT). An HBT is provided, comprising an extrinsic base, a first self-aligned silicide layer over the extrinsic base, and a nitride etch stop layer above the first self-aligned silicide layer. As described above, the height of the extrinsic base is greater than or equal to the height of the emitter and greater than or equal to the height of the first nitride layer. A continuous layer is also included between the first self-aligned silicide layer and the nitride etch stop layer, wherein the continuous layer can comprise oxide. The HBT further includes spacers adjacent the continuous layer, wherein the spacers and the continuous layer separate the extrinsic base from an emitter contact by covering the entire extrinsic base and first self-aligned silicide layer. As described above, the top surface of the continuous layer can be coplanar with the top of the spacers, for example, by deposition and polish back.

In addition, an emitter is provided, wherein the height of the emitter is less than or equal to the height of the extrinsic base. As described above, the emitter can be formed from poly, wherein the emitter contacts the LTE layer, the first oxide layer, the first nitride layer, and the second oxide layer. Moreover, a second self-aligned silicide layer is over the emitter, wherein the height of the second silicide layer is less than or equal to the height of the first silicide layer. As described above, an emitter contact is formed over the second self-aligned silicide layer, wherein the emitter contact touches the fourth oxide layer, the second nitride layer, a portion of the third oxide layer, and the spacers.

A method of forming an HBT comprises forming spacers and forming an extrinsic base adjacent the spacers. The spacers are used to form and self-align a first self-aligned silicide layer over the extrinsic base. Further, a continuous layer is formed over the first self-aligned silicide layer; and, a nitride etch stop layer is formed over the continuous layer. As described above, the nitride etch stop layer is formed over the third oxide layer, the spacers, and the nitride member; and, a fourth oxide layer is formed over the nitride etch stop layer. The spacers are formed, wherein the continuous layer is formed adjacent the spacers such that the spacers and the continuous layer separate the extrinsic base from an emitter contact. As described above, the spacers are formed on both sides of the emitter and the nitride member and over portions of the first nitride layer. The continuous layer can be formed using oxide, wherein, as described above, the top surface of the continuous layer can be coplanar with the top of the spacers, for example, by deposition and polish back.

The method also forms an emitter, wherein the extrinsic base is formed with a height that is greater than or equal to the height of the emitter. As described above, the emitter can be formed from poly, wherein the emitter contacts the LTE layer, the first oxide layer, the first nitride layer, and the second oxide layer. Moreover, a second self-aligned silicide layer is formed over the emitter with a height that is less than or equal to the height of the first silicide layer. As described above, an emitter contact is formed over the second self-aligned silicide layer, wherein the emitter contact is above the poly layer, and wherein a top surface of the emitter contact is coplanar with a top surface of the fourth oxide layer.

Figure 12:
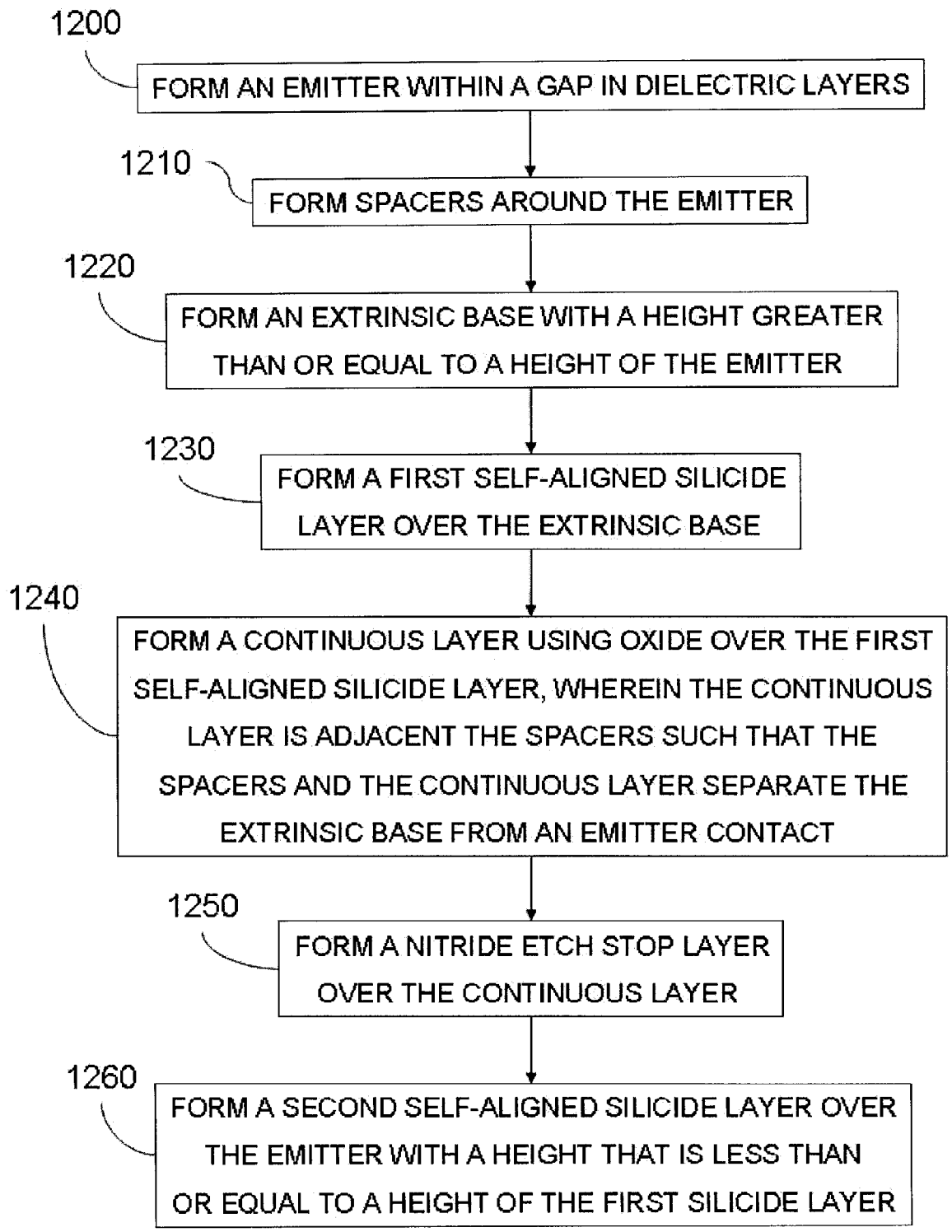
FIG. 12 is a flow diagram illustrating a method of forming an HBT.

FIG. 12 illustrates a flow diagram of a method of forming an HBT. In item 1200, the method forms an emitter within a gap in dielectric materials. As described above, the emitter has a thickness that is approximately similar to the thickness of the nitride member, wherein the emitter fills the bottom half of the first gap and the nitride member fills the top half of the first gap. Next, in item 1210, the method forms spacers. As described above, the spacers can be formed from oxide, wherein a top of the spacers are coplanar with the top surface of the nitride member.

Following this, in item 1220, an extrinsic base is formed with a height greater than or equal to a height of the emitter. As described above, the extrinsic base is adjacent to the first oxide layer and the first nitride layer and adjacent to and shorter than the spacers. Subsequently, in item 1230, a first self-aligned silicide layer is formed over the extrinsic base. As described above, the first silicide layer is adjacent to the spacers and below the top portion of the spacers.

In item 1240, the method then forms a continuous layer using oxide over the first self-aligned silicide layer, wherein the continuous layer is adjacent the spacers such that the spacers and the continuous layer separate the extrinsic base from an emitter contact by covering the entire extrinsic base and first self-aligned silicide layer. As described above, the top surface of the continuous layer can be coplanar with the top of the spacers, for example, by deposition and polish back.

Next, in item 1250, a nitride etch stop layer is formed over the continuous layer. As described above, the nitride etch stop layer is formed over the third oxide layer, the spacers, and the nitride member; and, a fourth oxide layer is formed over the nitride etch stop layer. Following this, in item 1260, a second self-aligned silicide layer is formed over the emitter with a height that is less than or equal to a height of the first silicide layer. As described above, an emitter contact is formed over the second self-aligned silicide layer, wherein the emitter contact touches the fourth oxide layer, the second nitride layer, a portion of the third oxide layer, and the spacers.

Accordingly, embodiments of the invention provide an HBT which offers a self-aligned extrinsic base and an emitter dimension defined by an opening process for better control and scaling. Furthermore, a self-aligned extrinsic base silicide is included, wherein the silicide reaches the emitter spacer, and wherein the silicide reduces the base resistance. In addition, embodiments herein comprise a plug emitter and a deep collector implant. The process scheme contacts an emitter poly narrower than the emitter contact with protection against emitter-base shorts that rely on a difference in material between a material covering the entire extrinsic-base and a material covering the emitter poly plug (borderless contact).

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments of the invention have been described in terms of preferred embodiments, those skilled in the art will recognize that the embodiments of the invention can be practiced with modification within the spirit and scope of the appended claims.

What is claimed is:

1. A heterojunction bipolar transistor, comprising:
an extrinsic base;
a self-aligned silicide layer over said extrinsic base;
a nitride etch stop layer above said self-aligned silicide layer;
a continuous layer between said self-aligned silicide layer and said nitride etch stop layer;
spacers adjacent said continuous layer,
wherein said spacers and said continuous layer are adapted to separate said extrinsic base from an emitter contact.

2. The heterojunction bipolar transistor according to claim 1, all the limitations of which are incorporated herein by reference, wherein said continuous layer comprises oxide.

3. The heterojunction bipolar transistor according to claim 1, all the limitations of which are incorporated herein by reference, further comprising an emitter, wherein a height of said emitter is one of less than and equal to a height of said extrinsic base.

4. The heterojunction bipolar transistor according to claim 1, all the limitations of which are incorporated herein by reference, further comprising:
an emitter; and
a second self-aligned silicide layer over said emitter, wherein a height of said second silicide layer is one of less than and equal to a height of said self-aligned silicide layer.

5. A heterojunction bipolar transistor, comprising:
an emitter;
an extrinsic base proximate said emitter;
a self-aligned silicide layer over said extrinsic base, wherein a height of said emitter is one of less than and equal to a height of said extrinsic base;
a nitride etch stop layer above said self-aligned silicide layer;
a continuous layer between said self-aligned silicide layer and said nitride etch stop layer; and
spacers adjacent said continuous layer,
wherein said spacers and said continuous layer are adapted to separate said extrinsic base from an emitter contact.

6. The heterojunction bipolar transistor according to claim 5, all the limitations of which are incorporated herein by reference, further comprising a second self-aligned silicide layer over said emitter, wherein a height of said second silicide layer is one of less than and equal to a height of said self-aligned silicide layer.

7. The heterojunction bipolar transistor according to claim 5, all the limitations of which are incorporated herein by reference, wherein said continuous layer comprises oxide.

* * * * *